United States Patent
Wurm et al.

(10) Patent No.: US 7,586,059 B2
(45) Date of Patent: Sep. 8, 2009

(54) LITHOGRAPHY MASK SUBSTRATE LABELING SYSTEM

(75) Inventors: Stefan Wurm, Austin, TX (US);
Thomas White, Austin, TX (US)

(73) Assignees: Infineon Technologies AG, Munich (DE); Advanced Micro Devices Inc., Sunnyvale, CA (US)

( * ) Notice: Subject to any disclaimer, the term of this patent is extended or adjusted under 35 U.S.C. 154(b) by 742 days.

(21) Appl. No.: 10/929,049

(22) Filed: Aug. 27, 2004

(65) Prior Publication Data

US 2006/0044385 A1 Mar. 2, 2006

(51) Int. Cl.
*B23K 26/067* (2006.01)

(52) U.S. Cl. .............................. 219/121.68; 219/121.69; 219/121.76

(58) Field of Classification Search ............ 219/121.68, 219/121.69, 121.76, 121.77
See application file for complete search history.

(56) References Cited

U.S. PATENT DOCUMENTS

| | | | |
|---|---|---|---|
| 4,092,518 A | | 5/1978 | Merard |
| 4,626,652 A | * | 12/1986 | Bjork et al. ............ 219/121.68 |
| 4,822,973 A | | 4/1989 | Fahner et al. |
| 5,253,198 A | * | 10/1993 | Birge et al. ................ 365/106 |
| 5,637,244 A | | 6/1997 | Erokhin |
| 5,708,252 A | * | 1/1998 | Shinohara et al. ...... 219/121.73 |
| 5,786,560 A | * | 7/1998 | Tatah et al. ............ 219/121.77 |
| 6,392,683 B1 | * | 5/2002 | Hayashi ...................... 347/224 |
| 6,442,974 B1 | | 9/2002 | Paananen et al. |
| 6,465,272 B1 | * | 10/2002 | Davis et al. .................... 438/72 |
| 6,562,698 B2 | * | 5/2003 | Manor ......................... 438/460 |
| 6,621,041 B2 | | 9/2003 | Hayashi et al. |
| 6,709,720 B2 | * | 3/2004 | Hayakawa et al. ........... 427/555 |
| 6,727,460 B2 | * | 4/2004 | Troitski ................. 219/121.68 |
| 6,886,748 B1 | * | 5/2005 | Moore ........................ 235/435 |
| 7,170,030 B2 | * | 1/2007 | Haight et al. ........... 219/121.69 |
| 2002/0044266 A1 | * | 4/2002 | Charles et al. ................. 355/76 |
| 2002/0056891 A1 | * | 5/2002 | Wu ............................. 257/620 |
| 2003/0048349 A1 | * | 3/2003 | Yamada et al. .............. 347/224 |
| 2004/0012767 A1 | * | 1/2004 | Van Elp et al. ................. 355/76 |
| 2004/0060910 A1 | | 4/2004 | Schramm |
| 2006/0091122 A1 | * | 5/2006 | Sugioka et al. ......... 219/121.69 |

FOREIGN PATENT DOCUMENTS

| JP | 2000-52070 A | * | 2/2000 |
|---|---|---|---|
| JP | 2001-199747 A | * | 7/2001 |
| JP | 2003-340588 A | * | 12/2003 |

OTHER PUBLICATIONS

Semiconductor Equipment and Materials International; Specification for Extreme Ultraviolet Lithography Mask Substrates; SEMI P37-1102; pp. 1-10; (2001-2002).
Semiconductor Equipment and Materials International; Specification for Marking of Hard Surface Extreme Ultraviolet Mask Substrates; SEMI T11-1102; pp. 1-5; (2002).

* cited by examiner

*Primary Examiner*—Geoffrey S Evans
(74) *Attorney, Agent, or Firm*—Dicke, Billig & Czaja, PLLC

(57) ABSTRACT

A substrate labeling system includes a first laser assembly having a first laser and a first lens, a second laser assembly having a second laser and a second lens, and a controller for directing the first laser and the second laser incident on a portion of a subsurface of a substrate to mark the substrate without generating particle defects on a surface of the substrate.

15 Claims, 5 Drawing Sheets

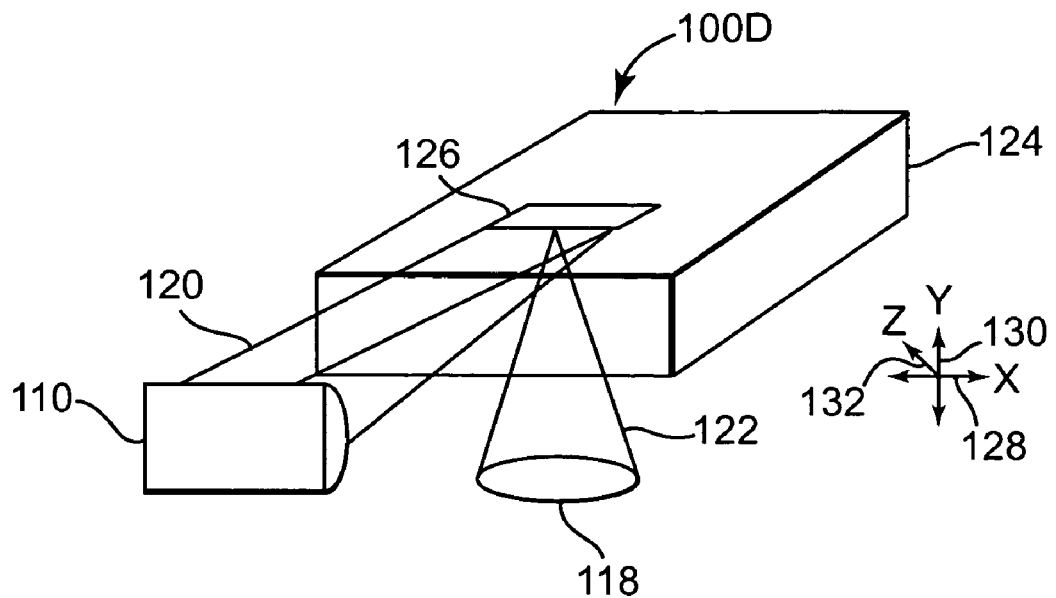
Fig. 4
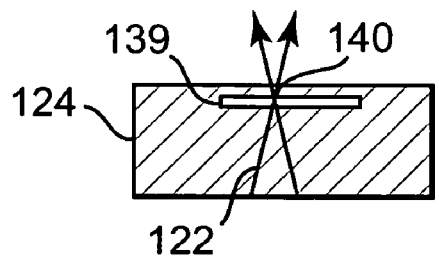
Fig. 5
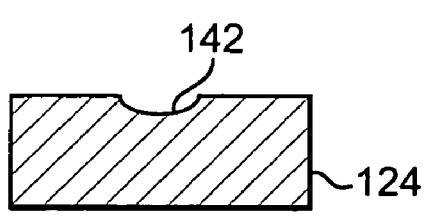 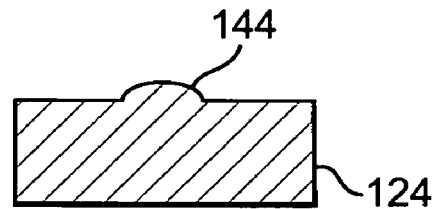
Fig. 6A     Fig. 6B

LITHOGRAPHY MASK SUBSTRATE LABELING SYSTEM

BACKGROUND

Photolithography is a process used in semiconductor device fabrication to transfer a pattern from a mask to the surface of a wafer or substrate. One type of mask is an extreme ultraviolet mask (EUV) for use with EUV lithography. Mask substrates, mask blanks, and finished patterned masks are subject to stringent defect specifications. These defect specifications are outlined in the Semiconductor Equipment and Materials International (SEMI) standards document SEMI P37-1102 and SEMI P38-1103, which call for 0.003 defects/$cm^2$ for the 45 nm node by the year 2009. Therefore, all processing steps, from the substrate level to a finished mask, have to generate as few defects as possible.

For tracking masks in an automated manufacturing environment, masks have to carry a permanent identification label that allows tracing a specific mask throughout its useful lifetime. Typically, these labels are applied to the surface of the mask substrate and destroy parts of that substrate surface. By destroying parts of the substrate surface, particle defects are generated.

SUMMARY

One embodiment of the present invention provides a substrate labeling system. The substrate labeling system comprises a first laser assembly having a first laser and a first lens, a second laser assembly having a second laser and a second lens, and a controller for directing the first laser and the second laser incident on a portion of a subsurface of a substrate to mark the substrate without generating particle defects on a surface of the substrate.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIG. 4 is a schematic diagram illustrating one embodiment of a mask substrate labeling system for generating pit features or bump features.

FIG. 5 is a diagram illustrating one embodiment of generating a pit feature or a bump feature.

FIG. 6A is a diagram illustrating one embodiment of a pit feature.

FIG. 6B is a diagram illustrating one embodiment of a bump feature.

DETAILED DESCRIPTION

Figure 1:
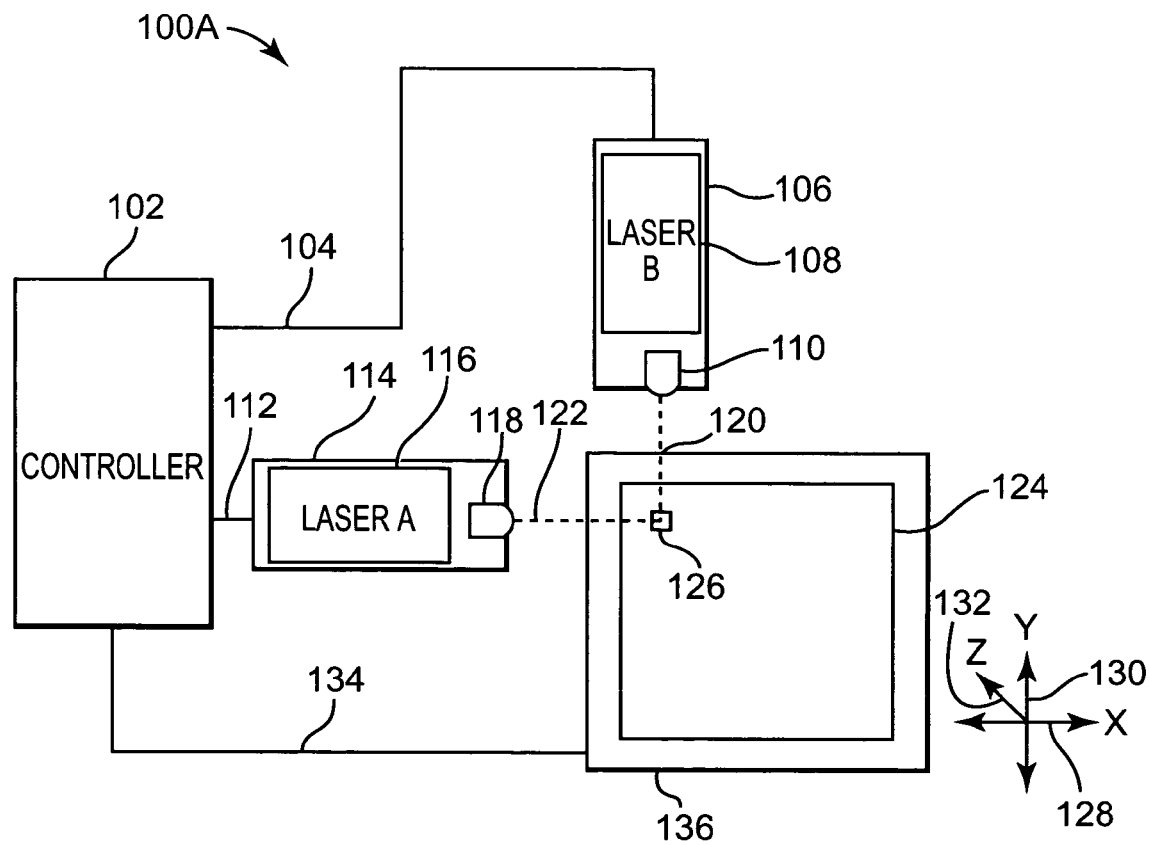
FIG. 1 is a schematic diagram illustrating one embodiment of a mask substrate labeling system.

FIG. 1 is a schematic diagram illustrating one embodiment of a mask substrate labeling system 100A. Mask substrate labeling system 100A operates to generate marks on mask substrates or on the subsurface of mask substrates without generating particle defects on the surface of the mask substrates. In one embodiment, the marks are used as unique identifiers for labeling masks. The marks can be read by label readers to enable tracking the masks in an automated manufacturing environment.

In one embodiment, mask substrate labeling system 100A includes a controller 102, laser A assembly 114, laser B assembly 106, and positioning stage 136. Laser A assembly 114 includes laser A 116 and lens 118. Laser B assembly 106 includes laser B 108 and lens 110. Controller 102 is electrically coupled to laser B assembly 106 through communication link 104, laser A assembly 114 through communication link 112, and positioning stage 136 through communication link 134. Substrate 124 is positioned on positioning stage 136. Substrate 124 includes a portion 126 where substrate 124 is labeled by laser assembly A 114 and laser assembly B 106.

In one embodiment, substrate 124 is a substrate for a mask used in lithography. For example, in one embodiment, substrate 124 is a substrate for a mask for extreme ultraviolet (EUV) lithography. In one form of the invention, substrate 124 comprises a transparent material. In one embodiment, substrate 124 is a near zero thermal expansion material, such as titania doped silica glass or two phase glass ceramics. In other embodiments, substrate 124 is another suitable material.

Portion 126 of substrate 124 is beneath the surface of substrate 124. In one embodiment, parts of portion 126 are melted to produces pit features or bump features on the surface of substrate 124 without generating defects on the surface of substrate 124. In another embodiment, parts of portion 126 are marked to form a barcode or dot code beneath the surface of substrate 124 without generating defects on the surface of substrate 124.

Laser A 116 and laser B 108 are $CO_2$ lasers, ruby lasers, excimer lasers, or other suitable lasers. Laser A 116 is focused on portion 126 through lens 118 and laser B 108 is focused on portion 126 through lens 110. Lens 118 is a cylindrical lens, convex lens, or other suitable lens, and lens 110 is a cylindrical lens, convex lens, or other suitable lens. Separately, the power densities of laser A 116 and laser B 108 are less than the power density required to damage substrate 124. Combined, however, when focused on a common location in substrate 124, the combined power densities of laser A 116 and laser B 108 have a magnitude greater than or equal to the power density required to damage substrate 124. Therefore, by selectively focusing laser A 116 and laser B 108 on common locations in substrate 124, substrate 124 is damaged or marked to generate a label in portion 126.

Positioning stage 136 moves substrate 124 relative to laser A assembly 114 and laser B assembly 106 in the X 128, Y 130, and Z 132 directions. In other embodiments, substrate 124 remains stationary while laser A assembly 114 and laser B assembly 106 are moved relative to substrate 124.

Controller 102 controls laser assembly A 114 through communication link 112, laser assembly B 106 through communication link 104, and positioning stage 136 though communication link 134 to generate a label in portion 126 of substrate 124. In one embodiment, controller 102 controls the pulse durations of laser A 116 and laser B 108. Controller 102, in one embodiment, adjusts the position of positioning stage 136 in the X 128, Y 130, and Z 132 directions to focus laser A 116 and laser B 108 on parts of portion 126 for generating a label.

In operation, laser A 116 provides a laser beam to lens 118, which focuses the laser beam, indicated at 122, on a part of portion 126 of substrate 124. Laser B 108 provides a laser beam to lens 110, which focuses the laser beam, indicated at 120, on the same part of portion 126. With the combined power density of both laser A 116 and laser B 108 focused on the same part of portion 126, the damage threshold of the material of substrate 124 is exceeded, and the material is damaged at the focus point.

In one embodiment, the damage at the focus point is a visible defect with thin hair like damage extending a short distance along the laser beam from the point defect. This damage leaves a permanent mark in the substrate. In another embodiment, the material is melted, and depending upon the ambient atmosphere and gas pressure, a pit feature or bump feature is generated on the surface of substrate 124 directly above the focus point.

Figure 2:
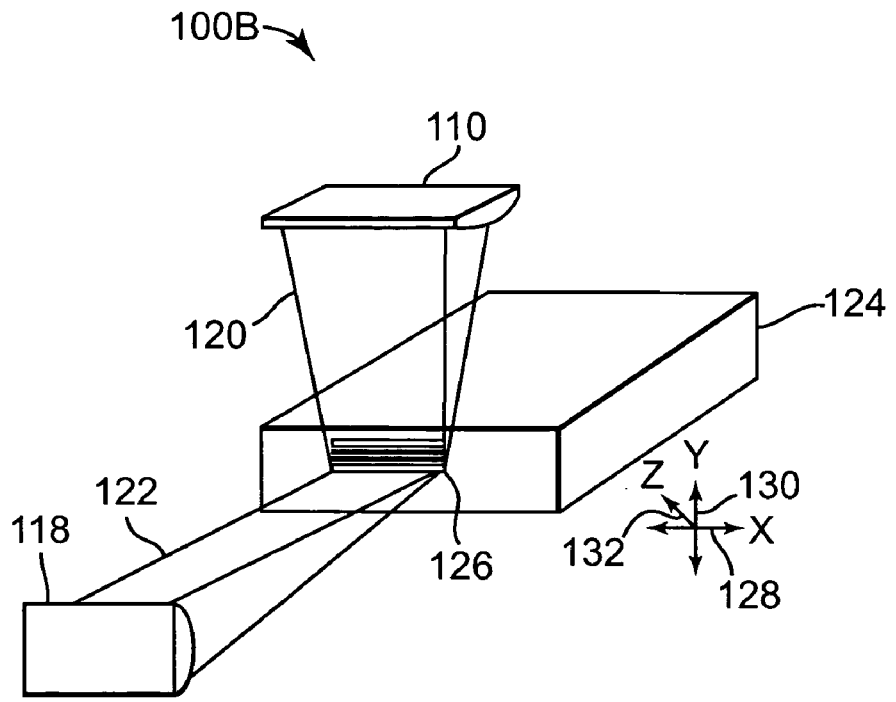
FIG. 2 is a schematic diagram illustrating one embodiment of a mask substrate labeling system for generating subsurface barcodes.

FIG. 2 is a schematic diagram illustrating one embodiment of a mask substrate labeling system 100B for generating barcodes in the subsurface of substrate 124 without generating particle defects on the surface of substrate 124. For mask substrate labeling system 100B, lens 110 is a cylindrical lens, and lens 118 is a cylindrical lens. Laser B 108 (FIG. 1) provides a laser beam to lens 110, which line focuses the laser beam, indicated at 120, on part of portion 126. Laser A 116 (FIG. 1) provides a laser beam to lens 118, which line focuses the laser beam, indicated at 122, on the same part of portion 126.

With the line focus of beam 120 and the line focus of beam 122 combined at the same location in portion 126, the damage threshold for the material of substrate 124 is exceeded and a bar like feature or mark is formed in substrate 124. By moving substrate 124 in the X 128, Y 130, and/or Z 132 direction to another position relative to laser A assembly 114 (FIG. 1) and laser B assembly 106 (FIG. 1), additional bars are written to generate a barcode in portion 126. Laser intensities and focusing lenses are selected to produce bars of specific sizes. The barcode is created without generating particle defects on the surface of substrate 124.

Figure 3:
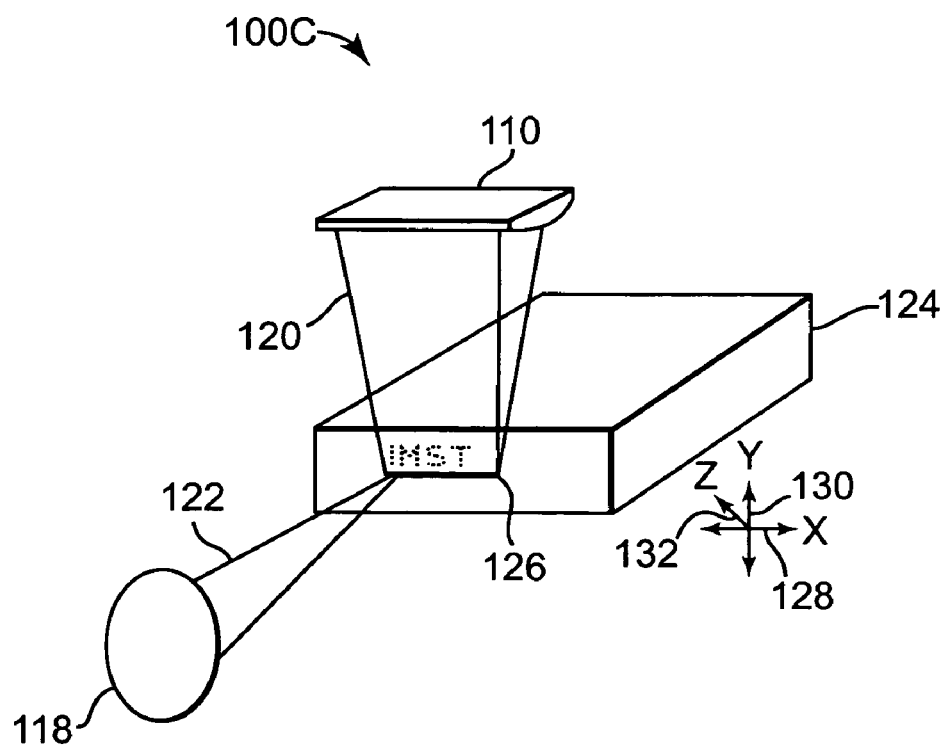
FIG. 3 is a schematic diagram illustrating one embodiment of a mask substrate labeling system for generating subsurface dot codes.

FIG. 3 is a schematic diagram illustrating one embodiment of a mask labeling system 100C for generating a dot code in the subsurface of substrate 124 without generating particle defects on the surface of substrate 124. For mask substrate labeling system 100C, lens 110 is a cylindrical lens, and lens 118 is a convex lens. Laser B 108 (FIG. 1) provides a laser beam to lens 110, which line focuses the laser beam, indicated at 120, on part of portion 126. Laser A 116 (FIG. 1) provides a laser beam to lens 118, which point focuses the laser beam, indicated at 122, on the same part of portion 126.

With the line focus of beam 120 and the point focus of beam 122 combined at the same location in portion 126, a dot like feature or mark is formed in substrate 124 at the intersection of the line focus and the point focus. By moving substrate 124 in the X 128, Y 130, and/or Z 132 direction to a new position relative to laser A assembly 114 (FIG. 1) and laser B assembly 106 (FIG. 1), additional dot like features are written to generate a dot code in portion 126. For example, if substrate 124 is moved in the X 128 direction, laser A 116 (FIG. 1) can produce marks along the length of the line focus from laser B 108 (FIG. 1). Laser intensities and focusing lenses are selected to produce dots of specific sizes. In one embodiment, the dot code is a data matrix. In other embodiments, the dot code can be configured to be alphanumeric characters, symbols, or one or more other images. The dot code is created without generating particle defects on the surface of substrate 124. In other embodiments, the lasers can be configured to produce alphanumeric characters, symbols, or one or more other images.

FIG. 4 is a diagram illustrating one embodiment of a mask substrate labeling system 100D for generating pit features or bump features on the surface of substrate 124 without generating particle defects on the surface of substrate 124. For mask substrate labeling system 100D, lens 110 is a cylindrical lens, and lens 118 is a convex lens. Laser B 108 (FIG. 1) provides a laser beam to lens 110, which line focuses the laser beam, indicated at 120, on part of portion 126. Laser A 116 (FIG. 1) provides a laser beam to lens 118, which point focuses the laser beam, indicated at 122, on the same part of portion 126.

With the line focus of beam 120 and the point focus of beam 122 combined at the same location in portion 126, the location in portion 126 is melted. As illustrated in FIG. 5, lens 110 provides a line focus 139 and lens 118 provides a point focus 140. At point 140, the material of substrate 124 becomes molten. The laser intensity and impulse duration is selected such that the material is slowly molten from behind the surface of substrate 124.

The volume where the substrate is made molten has a different density than the surrounding undamaged substrate material and a pit feature as illustrated in FIG. 6A at 142 is generated. The relative power of the beams 120 and 122 and the focal length of cylindrical lens 110 are selected such that the temperature gradients around the volume to be molten are low enough so that surface ablation due to thermal stress does not occur. In another embodiment, in a suitable ambient atmosphere and gas pressure (e.g., inert gas atmosphere, high pressure), a bump like surface feature as illustrated in FIG. 6B at 144 is generated using this subsurface melting method. By moving substrate 124 in the X 128, Y 130, and/or Z 132 direction to a new position relative to laser A assembly 114 (FIG. 1) and laser B assembly 106 (FIG. 1), additional pit features or bump features are written to generate a pit code or bump code, respectively, on the surface of substrate 124.

In one embodiment, if the pit features or bump features are generated in a suitable size, they are visible after substrate 124 is coated with another material, such as an EUV multilayer, and can therefore be registered even after coating. By choosing a suitable area at the rim of substrate 124 (i.e., outside the mask quality area as specified in SEMI P37-1102), and etching away absorber material deposited on top of this area during the mask patterning procedure, the labels (pit features or bump features) will be traceable as mask identifiers throughout the entire EUV mask lifetime.

Figure 7:
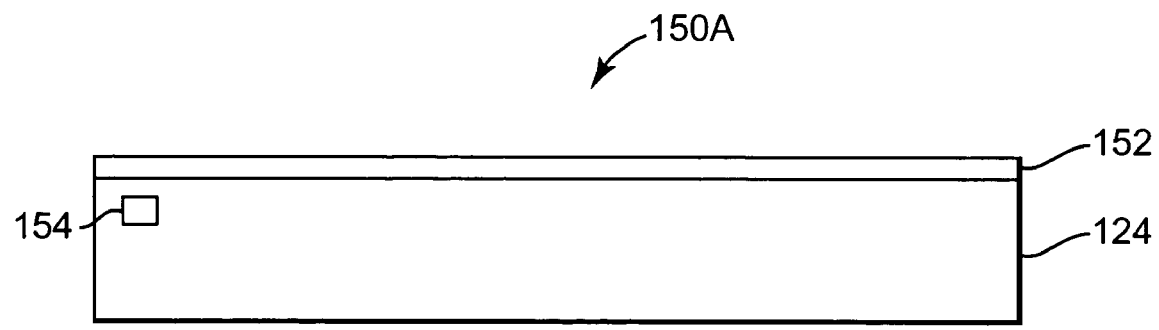
FIG. 7 is a side view of one embodiment of an optical mask having a subsurface label.

FIG. 7 is a side view of one embodiment of an optical mask 150A. Optical mask 150A includes substrate 124, subsurface label 154, and film layer 152. Portions of film layer 152 can be etched away to generate a patterned optical mask to transmit light through substrate 124 in optical lithography. Subsurface label 154 is a barcode or dot code that permanently identifies mask 150A without generating particle defects on the surface of substrate 124. Depending on the orientation of subsurface label 154 and the etching of film layer 152, subsurface label 154 is visible from the side, top, and/or bottom of substrate 124.

Figure 8:
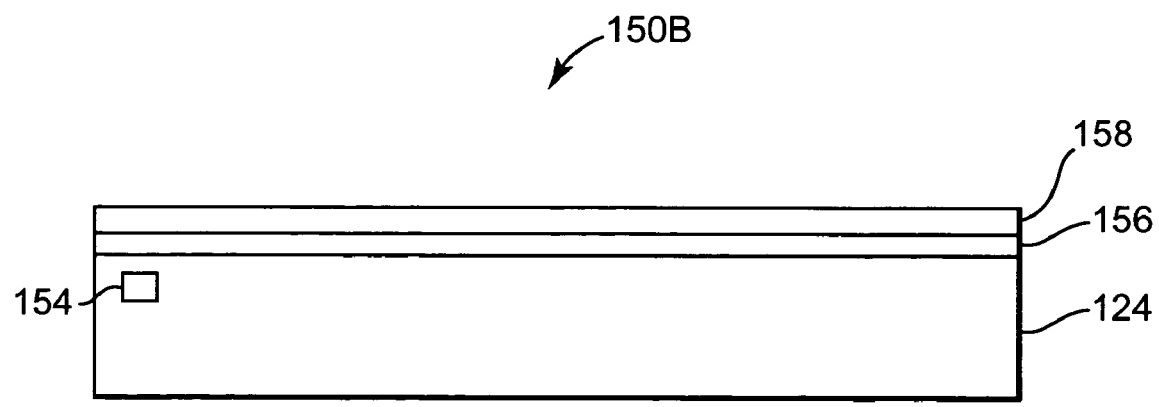
FIG. 8 is a side view of one embodiment of an extreme ultraviolet (EUV) mask having a subsurface label.

FIG. 8 is a side view of one embodiment of an EUV mask 150B. EUV mask 150B includes substrate 124, subsurface label 154, multilayer reflection layer 156, and conductive or absorption layer 158. Portions of conductive or absorption layer 158 can be etched away to generate a patterned EUV mask to reflect light from the multilayer reflection layer 156 in EUV lithography. Subsurface label 154 is a barcode or dot code that permanently identifies mask 150B without generating particle defects on the surface of substrate 124. Depending on the orientation of subsurface label 154 and the etching of conductive or absorption layer 158, subsurface label 154 is visible from the side, top, and/or bottom of substrate 124.

Figure 9:
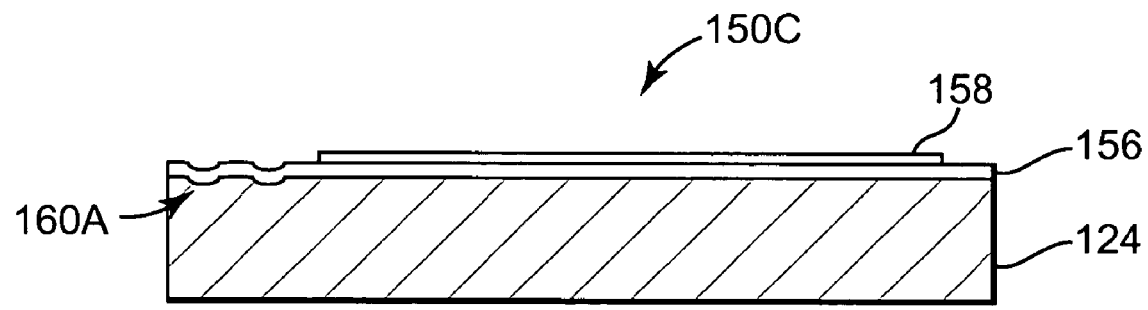
FIG. 9 is a cross-sectional side view of one embodiment of an EUV mask having a label formed from pit features.

FIG. 9 is a cross-sectional side view of one embodiment of an EUV mask 150C. EUV mask 150C includes substrate 124, multilayer reflection layer 156, conductive or absorption layer 158, and a label 160A formed from pit features. Portions of conductive or absorption layer 158 are etched away to expose label 160A, which is visible in multilayer reflection layer 156. Other portions of conductive or absorption layer 158 can be etched away to generate a patterned EUV mask to reflect light from the multilayer reflection layer 156 in EUV lithography. Label 160A permanently identifies mask 150C without generating particle defects on the surface of substrate 124.

Figure 10:
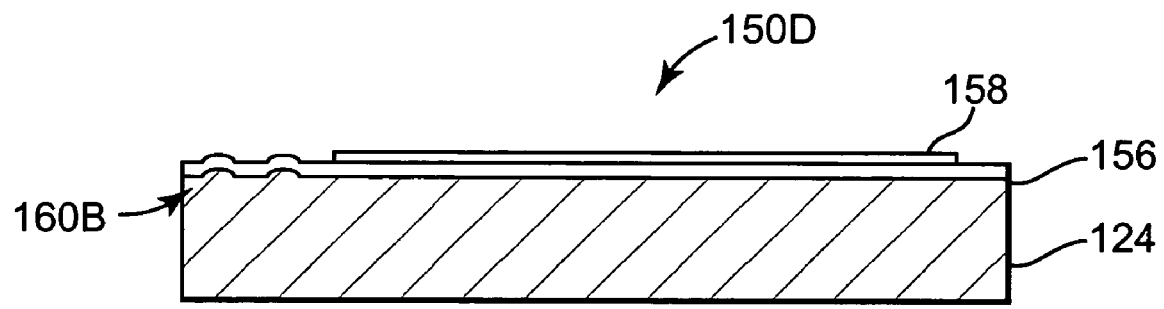
FIG. 10 is cross-sectional side view of one embodiment of an EUV mask having a label formed from bump features.

FIG. 10 is a cross-sectional side view of one embodiment of an EUV mask 150D. EUV mask 150D includes substrate 124, multilayer reflection layer 156, conductive or absorption layer 158, and a label 160B formed from bump features. Portions of conductive or absorption layer 158 are etched away to expose label 160B, which is visible in multilayer reflection layer 156. Other portions of conductive or absorption layer 158 can be etched away to generate a patterned EUV mask to reflect light from the multilayer reflection layer 156 in EUV lithography. Label 160B permanently identifies mask 150D without generating particle defects on the surface of substrate 124.

What is claimed is:

1. A substrate labeling system comprising:
   a first laser assembly having a first laser and a first lens;
   a second laser assembly having a second laser and a second lens; and
   a controller for directing a first laser beam from the first laser and a second laser beam from the second laser incident on a portion of a subsurface of one of a titania doped silica glass substrate and a two phase glass ceramics substrate to mark the substrate without generating particle defects on a surface of the substrate,
   wherein the first lens comprises a first cylindrical lens for providing a first line focus and the second lens comprises a second cylindrical lens for providing a second line focus, and wherein the mark comprises a subsurface bar.

2. The substrate labeling system of claim 1, wherein the mark comprises a unique identifier unique to the substrate.

3. The substrate labeling system of claim 1, wherein the controller is adapted to generate a subsurface bar code in the substrate.

4. A substrate labeling system comprising:
   a first laser assembly having a first laser and a first lens;
   a second laser assembly having a second laser and a second lens; and
   a controller for directing a first laser beam from the first laser and a second laser beam from the second laser incident on a portion of a subsurface of a substrate to mark the substrate without generating particle defects on a surface of the substrate,
   wherein the first lens comprises a first cylindrical lens for providing a first line focus and the second lens comprises a second cylindrical lens for providing a second line focus, and wherein the mark comprises a subsurface bar.

5. The substrate labeling system of claim 4, wherein the substrate comprises a near zero thermal expansion material.

6. The substrate labeling system of claim 4, wherein a power density of the first laser beam is below a damage threshold of the substrate and a power density of the second laser beam is below the damage threshold of the substrate.

7. The substrate labeling system of claim 6, wherein a magnitude of the power density of the first laser beam combined with the power density of the second laser beam exceeds the damage threshold of the substrate.

8. A method for labeling a substrate, the method comprising:
   focusing a first laser beam through a first lens on a first portion of a subsurface of a substrate, the first laser beam having a power density less than a damage threshold of the substrate; and
   focusing a second laser beam through a second lens on the first portion of the subsurface of the substrate, the second laser beam having a power density less than the damage threshold of the substrate,
   wherein a magnitude of a combination of the power density of the first laser beam and the power density of the second laser beam focused on the first portion marks the first portion without generating particle defects on a surface of the substrate,
   wherein the first lens comprises a cylindrical lens and the second lens comprises a cylindrical lens, and wherein focusing the first laser beam comprises line focusing the first laser beam, and focusing the second laser beam comprises line focusing the second laser beam, and wherein the magnitude of the combination of the power density of the first laser beam and the power density of the second laser beam focused on the first portion marks the first portion in a form of a bar.

9. The method of claim 8, further comprising:
   focusing the first laser beam on a second portion of the subsurface of the substrate; and
   focusing the second laser beam on the second portion of the subsurface of the substrate,
   wherein the magnitude of the combination of the power density of the first laser beam and the power density of the second laser beam focused on the second portion marks the second portion without generating particle defects on the surface of the substrate.

10. The method of claim 9, further comprising:
    marking a plurality of portions of the subsurface of the substrate to form a bar code.

11. A method for labeling a substrate, the method comprising:
    focusing a first laser beam through a first lens on a first portion of a subsurface of a substrate, the first laser beam having a power density less than a damage threshold of the substrate; and
    focusing a second laser beam through a second lens on the first portion of the subsurface of the substrate, the second laser beam having a power density less than the damage threshold of the substrate,
    wherein a magnitude of a combination of the power density of the first laser beam and the power density of the second laser beam focused on the first portion melts the first portion to form a feature on a surface of the substrate without generating particle defects on the surface of the substrate.

12. The method of claim 11, wherein the magnitude of the combination of the power density of the first laser beam and the power density of the second laser beam focused on the first portion melts the first portion to form a pit feature on the surface of the substrate.

13. The method of claim 12, further comprising:
melting a plurality of portions of the subsurface of the substrate to form a code of pit features.

14. The method of claim 11, wherein the magnitude of the combination of the power density of the first laser beam and the power density of the second laser beam focused on the first portion melts the first portion to form a bump feature on a surface of the substrate.

15. The method of claim 14, further comprising:
melting a plurality of portions of the subsurface of the substrate to form a code of bump features.

* * * * *